(12) United States Patent
Shigeto et al.

(10) Patent No.: US 11,120,967 B2
(45) Date of Patent: Sep. 14, 2021

(54) CHARGED PARTICLE BEAM APPARATUS AND SAMPLE OBSERVATION METHOD USING SUPERIMPOSED COMPARISON IMAGE DISPLAY

(71) Applicant: Hitachi High-Technologies Corporation, Tokyo (JP)

(72) Inventors: Kunji Shigeto, Tokyo (JP); Mitsugu Yamashita, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 80 days.

(21) Appl. No.: 16/345,520

(22) PCT Filed: Nov. 22, 2016

(86) PCT No.: PCT/JP2016/084564
§ 371 (c)(1),
(2) Date: Apr. 26, 2019

(87) PCT Pub. No.: WO2018/096575
PCT Pub. Date: May 31, 2018

(65) Prior Publication Data
US 2019/0279838 A1    Sep. 12, 2019

(51) Int. Cl.
*H01J 37/22* (2006.01)
*G06T 7/73* (2017.01)
(Continued)

(52) U.S. Cl.
CPC .............. *H01J 37/222* (2013.01); *G06T 7/74* (2017.01); *H01J 37/20* (2013.01); *H01J 37/22* (2013.01);
(Continued)

(58) Field of Classification Search
None
See application file for complete search history.

(56) References Cited

U.S. PATENT DOCUMENTS

| 2002/0035329 A1 | 3/2002 | Kamiyama |
| 2007/0045538 A1 | 3/2007 | Ikeda et al. |

(Continued)

FOREIGN PATENT DOCUMENTS

| CN | 102484025 A | 5/2012 |
| CN | 103185728 A | 7/2013 |

(Continued)

OTHER PUBLICATIONS

Japanese-language Office Action issued in counterpart Japanese Application No. 2018-552285 dated Feb. 4, 2020 with English translation (six (6) pages).
(Continued)

*Primary Examiner* — James Choi
(74) *Attorney, Agent, or Firm* — Crowell & Moring LLP (57) ABSTRACT

In the case of an in situ observation with a charged particle beam apparatus, an observer who is not an expert in the charged particle beam apparatus needs to maintain the field of view of the observation that changes from moment to moment while watching a monitor, and thus, adjustment of the field of view needs to be controllable in real time with a good operability. In order to eliminate the need for an observer to move the line of sight, a live image and a comparison image are overlapped and displayed. At this time, an interface is devised, such that overlapping of two images can be executed without giving stress to the observer. The observer presses a button on an operation screen, thereby displaying a superimposed image, which is obtained by making the comparison image matching the size of a first display area configured to display the live image translucent and superimposing the translucent comparison image on the live image, at the position of the first display area of the image display device.

7 Claims, 6 Drawing Sheets

(51) Int. Cl.
  *H01J 37/285* (2006.01)
  *H01J 37/24* (2006.01)
  *H01J 37/20* (2006.01)

(52) U.S. Cl.
  CPC ............ *H01J 37/24* (2013.01); *H01J 37/285* (2013.01); *G06T 2207/10061* (2013.01)

(56) References Cited

U.S. PATENT DOCUMENTS

| | | | |
|---|---|---|---|
| 2009/0214122 A1 | 8/2009 | Ikeda et al. | |
| 2009/0222753 A1* | 9/2009 | Yamaguchi | G06T 7/0004 715/771 |
| 2011/0063431 A1 | 3/2011 | Kiyohara et al. | |
| 2012/0132803 A1 | 5/2012 | Hirato et al. | |
| 2012/0287257 A1* | 11/2012 | Chino | H01J 37/22 348/80 |
| 2013/0170731 A1 | 7/2013 | Hirota | |
| 2015/0136977 A1 | 5/2015 | Buxbaum | |
| 2016/0064183 A1 | 3/2016 | Nagaoki et al. | |
| 2016/0133434 A1 | 5/2016 | Kuramoto | |

FOREIGN PATENT DOCUMENTS

| | | | |
|---|---|---|---|
| CN | 104795302 A | | 7/2015 |
| JP | 2002-85409 A | | 3/2002 |
| JP | 2004-505 A | | 1/2004 |
| JP | 2006-72689 A | | 3/2006 |
| JP | 2006072689 A | * | 3/2006 |
| JP | 2007-47930 A | | 2/2007 |
| JP | 2007-52972 A | | 3/2007 |
| JP | 2009-61178 A | | 3/2009 |
| JP | 2011-114043 A | | 6/2011 |
| JP | 2012-18818 A | | 1/2012 |
| JP | 2013-140042 A | | 7/2013 |
| JP | 2014-203594 A | | 10/2014 |
| JP | 2015-25965 A | | 2/2015 |
| JP | 2015-156393 A | | 8/2015 |
| JP | 5889464 B2 | | 3/2016 |
| JP | 2016-91893 A | | 5/2016 |

OTHER PUBLICATIONS

International Search Report (PCT/ISA/210) issued in PCT Application No. PCT/JP2016/084564 dated Feb. 28, 2017 with English translation (four (4) pages).

Japanese-language Written Opinion (PCT/ISA/237) issued in PCT Application No. PCT/JP2016/084564 dated Feb. 28, 2017 (three (3) pages).

Chinese-language Office Action issued in Chinese Application No. 201680090391.8 dated Sep. 2, 2020 with English translation (15 pages).

* cited by examiner

CHARGED PARTICLE BEAM APPARATUS AND SAMPLE OBSERVATION METHOD USING SUPERIMPOSED COMPARISON IMAGE DISPLAY

TECHNICAL FIELD

The present invention relates to a charged particle beam apparatus and a sample observation method using the same.

BACKGROUND ART

A charged particle beam apparatus represented by a scanning electron microscope scans a desired region (field of view) on a sample with a charged particle beam and records charged particle signals emitted from the scanned region in correspondence with scanning positions, thereby imaging an observation point. PTL 1 discloses a technique for correcting an electron beam irradiation point by using pattern matching in order to maintain an electron beam irradiation area constant in the case of continuously obtaining images or accumulating analysis result data for a long time.

On the other hand, although not a technique related to a charged particle beam apparatus, PTL 2 discloses an image processing technique for synthesizing still image data with moving picture data displayed in real time and displaying a result of the synthesis. In order to capture symmetrical face images more precisely, when capturing a left-face image, a right-face image captured in advance is horizontally inverted and synthesized with a left-face image displayed in real time and a result of the synthesis is displayed. Face images are captured by adjusting the angle of a face such that the left-face image displayed in real time matches as much as possible with the right-face image which is horizontally inverted, thereby capturing a symmetrical face image more precisely.

CITATION LIST

Patent Literature

PTL 1: JP-A-2016-91893
PTL 2: JP-A-2009-61178

SUMMARY OF INVENTION

Technical Problem

When a sample for observation is not changed with the lapse of time or when a change of the sample is caused by an operation of an observer as in PTL 1, sufficient time can be used to adjust the field of view, and thus precision of the adjustment of the field of view can be emphasized and positional deviations of obtained image data can be digitized and controlled by using various image processing techniques. On the other hand, there is a growing need for a charged particle beam apparatus to make in situ observation of microscopic changes caused by adding heat or applying mechanical force to a sample. In such a case, an observer who is not an expert in the charged particle beam apparatus needs to maintain the field of view of the observation that changes from moment to moment while watching a monitor, and thus adjustment of the field of view needs to be controllable in real time with good operability.

Adjustment of the field of view is performed by comparing a reference comparison image and a live image of an observation. However, since the movement of the field of view becomes more significant at observations at high magnifications, it is considered effective to overlap and display two images in order to eliminate the need for an observer to move the line of sight. To this end, it is desirable to apply the image processing technique as disclosed in PTL 2. However, PTL 2 relates to an application field in which image capturing conditions are allowed to be adjusted over sufficient time and an object to be captured is also a relatively large object, that is, a face. In contrast, in the case of observing a sample in situ, an observer tries to observe changes occurring in the field of view. A live image and a comparison image, which are displayed on a screen with sizes corresponding to an object for observation, are not necessarily displayed on a screen with the same display size. Even in such a case, the present invention provides a scanning electron microscope and a sample observation method enabling an observer to focus on an in-situ observation while adjusting the field of view with a simple operation by devising an interface to overlap two images without giving stress to the observer.

Solution to Problem

There is provided a charged particle beam apparatus including: a charged particle optical system including a charged particle beam source, a focusing lens configured to focus a primary charged particle beam emitted from the charged particle beam source, an objective lens configured to focus the primary charged particle beam onto a sample, a deflector coil configured to scan the sample with the primary charged particle beam, and a detector configured to detect secondary charged particles generated by the irradiation of the primary charged particle beam on the sample; an operation panel configured to receive controls of an operator; an image display device including a plurality of display areas; a control device connected to the operation panel and the image display device and including a device controller and a display controller; and a storage device configured to store image data captured by the charged particle optical system, wherein the device controller receives a control from the operation panel, controls the charged particle optical system, and obtains image data, the display controller displays a live image obtained from the charged particle optical system in a first display area of the image display device and displays a comparison image stored in the storage device in a second display area of the image display device, and the display controller receives a control from the operation panel and displays a superimposed image, which is obtained by making the comparison image matching the size of the first display area translucent and superimposing the translucent comparison image on the live image, at the position of the first display area of the image display device.

Advantageous Effects of Invention

The field of view can be adjusted without moving the line of sight from a live image on an image display device.

DESCRIPTION OF EMBODIMENTS

Embodiments of the present invention will be described below with reference to the drawings. In the embodiments described below, a scanning electron microscope (SEM) will be described as an example of a charged particle beam apparatus, but the present invention is not limited thereto. For example, the present invention may also be applied to a focused ion beam (FIB) device that uses a liquid metal ion source or a gas ion source as a charged particle beam source and irradiates an ion beam (charged particle beam) emitted therefrom onto a sample, a transmission electron microscope (TEM) a scanning transmission electron microscope (STEM), a scanning ion microscope, a scanning probe microscope, an optical microscope, a laser microscope, and the like.

Figure 1:
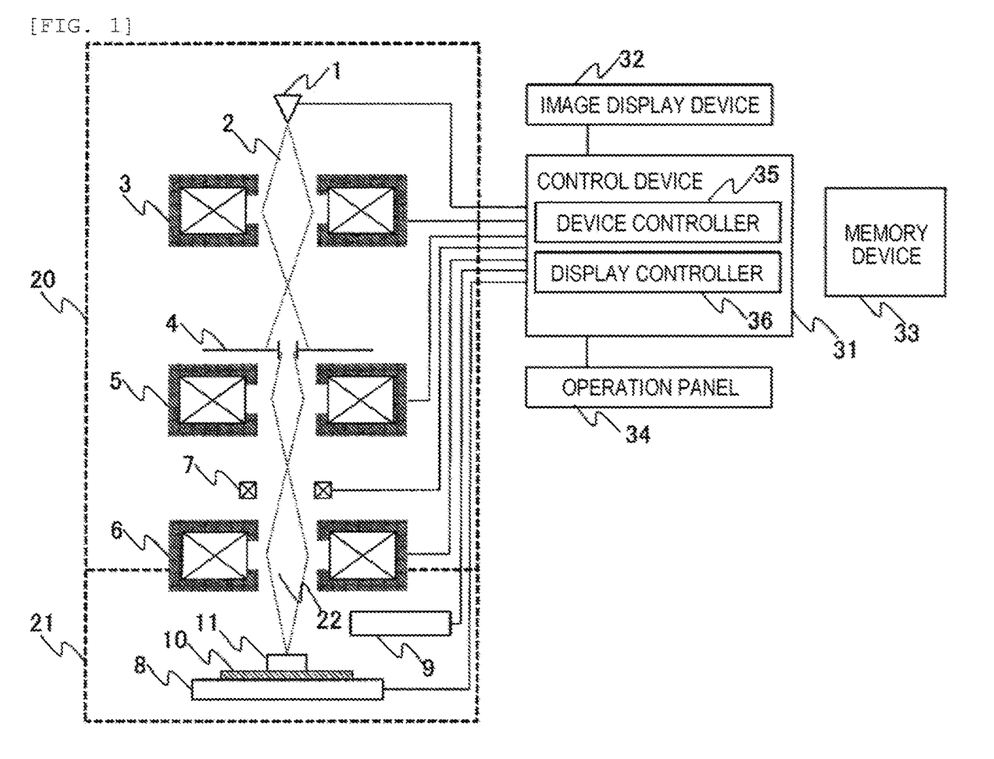
FIG. 1 is a schematic diagram of a scanning electron microscope according to an embodiment of the present invention.

FIG. 1 is a schematic diagram of a scanning electron microscope according to an embodiment of the present invention. A primary electron beam 2 emitted from an electron gun (charged particle beam source) 1 is once focused by a first focusing lens 3 and then spreads. The outer peripheral portion of the spread primary electron beam is shielded by an objective aperture 4, and thus a center portion of the beam having a predetermined diameter is transmitted. By switching the focal position of the first focusing lens 3 and the aperture amount of the objective aperture 4, a beam current amount to be irradiated onto a sample 11 can be adjusted. A primary electron beam that passed through the objective aperture 4 is focused by a second focusing lens 5 and an objective lens 6 onto the sample 11 placed on a sample stage 8. The primary electron beam is scanned on the sample 11 by the action of a deflector coil 7. Signal electrons (secondary electrons) generated from the sample 11 by the irradiation of the primary electron beam are detected by the detector 9.

This electron optical system is arranged in a lens barrel 20 that is vacuum-exhausted and the sample stage 8 is arranged in a sample chamber 21 that is vacuum-exhausted. Also, the hardware of the SEM is controlled by a control device 31. The control device 31 may be configured as hardware dedicated to processing or may be configured as software to be executed by using a general-purpose processor (e.g., a CPU, a GPU, a DSP, etc.). Furthermore, an image display device 32, a storage device 33 and an operation panel 34 are connected to the control device 31. On the image display device 32, an image under observation with an SEM or an operation screen necessary for an observer to control the SEM is displayed as described later. The storage device 33 stores an SEM control program as well as images (including a still image and a moving picture) taken with the SEM. The operation panel 34 is an interface for inputting an instruction of an observer and is implemented as hardware, such as a keyboard, a mouse, and a pointer. For example, while viewing an image displayed on the image display device 32, the observer moves the sample stage 8 in XYZ directions (X and Y denote two axes in a plane vertical to the optical axis direction of a primary electron beam, and Z denotes an axis along the optical axis direction of the primary electron beam) to search for a desired observation point.

Here, in the example shown in FIG. 1, the sample 11 is placed on the sample stage 8 via a sub-stage 10. The sub-stage 10 is a stage that applies a predetermined action to a sample, for example, heating the sample or applying a force to the sample. When observing microscopic changes occurring in the sample 11 by applying some actions to the sample 11 (referred to as "in-situ observation"), a sub-stage capable of applying a predetermined action to the sample 11 is prepared. In order to load a sub-stage into the sample chamber 21, a relatively large inlet is required in the sample chamber 21. Also, several holes are provided in the sample chamber 21. The holes are normally closed. However, incase of using the sub-stage 10, wires required for controlling the sub-stage 10 are drawn out from the holes. The drawn-out wires are connected to a power supply and a control unit in order to operate the sub-stage 10. The control of the sub-stage 10 is usually performed by a separate control device (a PC or the like) different from the control device for the SEM, but the same control device may be used.

The sample chamber 21 is connected to the lens barrel 20 via an opening 22 through which a primary electron beam passes. Therefore, when the vacuum degree of the sample chamber 21 decreases, the vacuum degree of the lens barrel 20 also decreases. Particularly, since there are members requiring a high vacuum degree, such as the electron gun 1 and the objective aperture 4, in the lens barrel 20, observation cannot be started unless the vacuum degree reaches a predetermined level again. In order to reduce the time from introduction of a sample to initiation of observation, it is desirable to reduce the influence of the decrease in the vacuum degree of the sample chamber 21 to the lens barrel 20.

Therefore, a mechanism for suppressing the decrease of the vacuum degree of the sample chamber 21 from being transmitted to the lens barrel 20 side is provided. For example, by arranging a differential exhaust throttle (not shown) for suppressing the decrease in the vacuum degree in a region of the lens barrel 20 where members 1 and 4 requiring a particularly high vacuum degree or by using a Schottky electron gun as the electron gun 1, the time from the opening of the sample chamber 21 to the initiation of observation after another vacuum exhaustion can be reduced.

Figure 2:
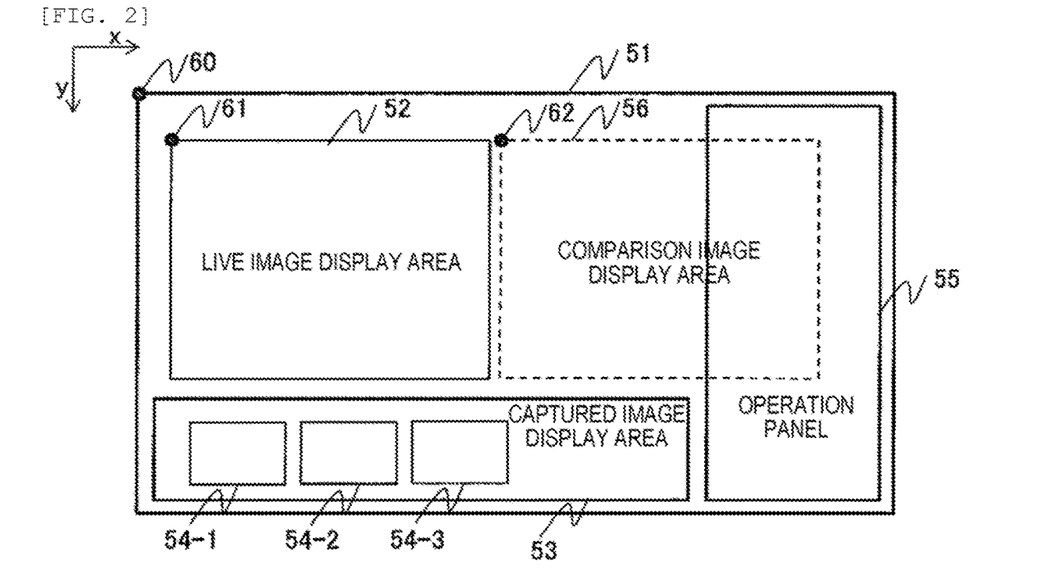
FIG. 2 is a diagram showing an example of an operation screen.

For example, an example of observing a change of the sample 11 while heating the sample 11 will be described. The sample chamber 21 is opened, and the sample heating sub-stage 10 with the sample 11 set thereon is set on the sample stage 8. Thereafter, the sample chamber 21 is vacuum-exhausted. After vacuum exhaustion is completed, an electron beam is irradiated onto the sample 11, and an image of the current observation is displayed on the image display device 32. FIG. 2 shows an example of an operation screen 51 displayed on the image display device 32.

The operation screen 51 includes a live image display area 52, a captured image display area 53, and an operation panel 55. Various parameters for controlling the SEM for observation are displayed on the operation panel 55, and an observer performs parameter adjustment via the operation panel 34. Since parameters for capturing appropriate images under predetermined conditions are stored in advance in the storage device 33, appropriate parameters may be read out from the storage device 33 and the observer may not need to change the predetermined parameters in most cases. In the live image display area 52, an image of the current observation with the SEM is displayed.

Also, when the observer captures an image during the observation, corresponding image data is stored in the storage device 33. In addition, a reduced image 54-i (i is an integer) of the captured image is displayed in the captured image display area 53. All of a series of images captured during a single observation are displayed in the captured image display area 53. Here, images may not only be still images, but also be moving pictures. In the case of a moving picture, for example, an initial image is displayed as a representative image thereof.

It is assumed that the observer observes changes of the sample 11 while gradually increasing the temperature of the sample 11 from room temperature to a target temperature A and to a target temperature B. First, the sample stage 8 is moved at room temperature and a field of view for observation is decided. The field of view for observation includes markers that do not change their positions and shapes even if the temperature rises, such that the observer maintains the same field of view. For example, a foreign object included in the field of view can be used as a marker. When the field of view is decided, an image thereof is captured. A reduced captured image 54 is displayed in the captured image display area 53.

For example, when a reduced image 54-1 is double-clicked, the reduced image 54-1 is displayed in a comparison image display area 56. The comparison image display area 56 is a window different from areas 52, 53, and 55 and displays the captured image 54-1 as an image of the same size and the same magnification as in the live image display area 52. Since images are opened in different windows, the comparison image display area 56 can be displayed at any position on the operation screen 51. The live image display area 52 and the comparison image display area 56 can be displayed with different display sizes. This is because it is desirable that a target of interest of an observer is displayed on an operation screen with an appropriate size.

Figure 3:
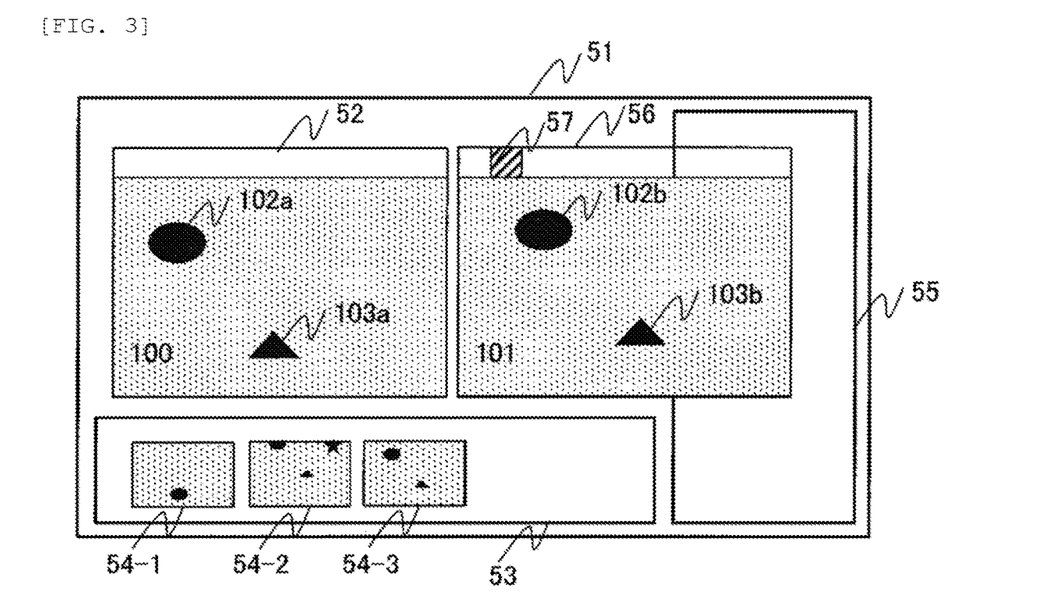
FIG. 3 is a diagram showing an example of an operation screen.

When the target temperature A is set and the heating of the sample 11 is started, the temperature of the sample 11 starts to rise toward the target temperature A. As the temperature of the sample 11 rises, the periphery of the sample 11 also is warmed up and thermally expands as a whole, and thus the field of view continues to gradually move from the observation position determined at a room temperature. Therefore, it is necessary to operate the sample stage 8 so as not to lose the field of view. When the live image display area 52 and the comparison image display area 56 are arranged adjacent to each other as shown in FIG. 3, comparison of two images may be facilitated. However, for example, it is difficult to determine whether a foreign object image 102 and a foreign object image 103, which are markers of the field of view, are at the same positions in a live image 100 and a comparison image 101. Since there is a case where a live image is changed instantaneously due to a temperature change, if an observer happens to move the line of sight to a comparison image display area at such a timing, the target field of view may be lost.

Figure 4:
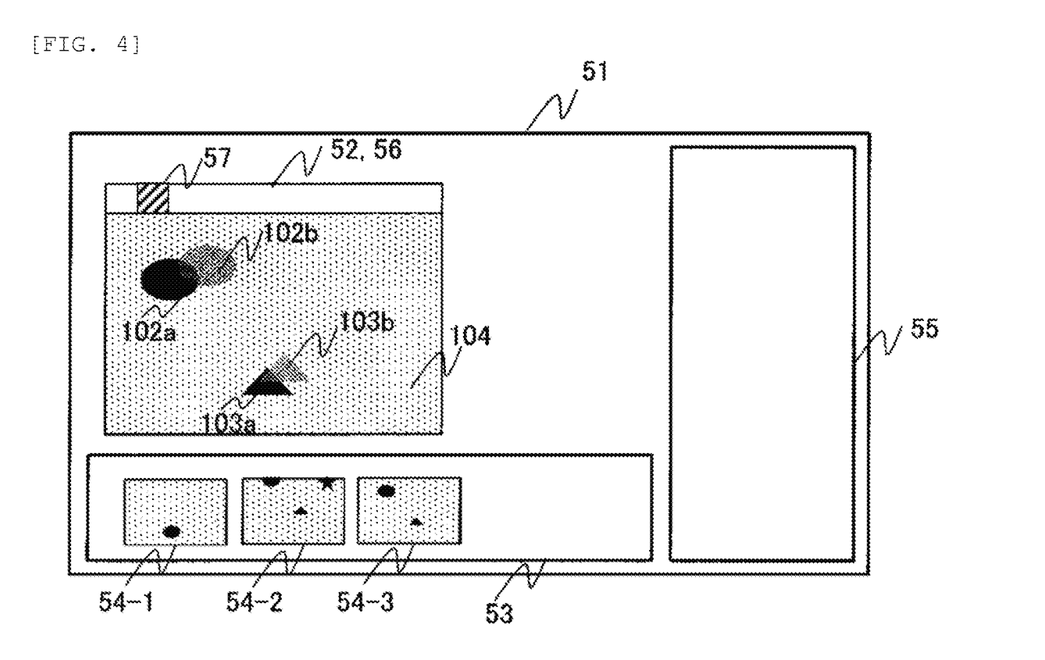
FIG. 4 is a diagram showing an example of an operation screen.

Therefore, in the present embodiment, a button 57 is provided at the upper portion of a window displaying the comparison image 101. When the button 57 is clicked, a superimposed image 104, which is obtained by making the comparison image 101 translucent and superimposing the same on the live image 100, is displayed as illustrated in FIG. 4. As images are overlapped, since it is not necessary to move the line of sight from the live image 100 for adjusting the field of view and the comparison image 101 is translucent, it is easy to determine whether a marker is a marker of the live image 100 or a marker of the comparison image 101.

When the temperature of the sample 11 reaches the set target temperature A and stabilizes, movement of the field of view is stopped. The field of view is finely adjusted by operating the sample stage 8 and an image is captured. A reduced image of the captured image is displayed in the captured image display area 53. When the button 57 is clicked again in the state where images are overlapped, the operation screen 51 returns to the state shown in FIG. 3. In other words, the comparison image 101 returns to its original transparency and is displayed in a different window at a position different from that in the live image. Alternatively, the comparison image 101 may be removed from the operation screen 51.

Next, when the target temperature B is set, the temperature of the sample 11 starts to rise toward the target temperature B. The observer may use an image captured at room temperature or an image captured at the target temperature A as a comparison image. Since any of captured images is displayed in the captured image display area 53, it is easy to make a selection. Thereafter, the observation can be continued in the same regard.

In addition, incase of applying a tension force to the sample 11 and observing changes thereof, a sub-stage for pulling the sample 11 is prepared. When the sample 11 is pulled in two opposite directions and deformed, the field of view except the center portion moves. In such a case, by using the operation screen according to the present embodiment, the field of view can be adjusted without moving the line of sight from the live image 100.

Figure 5:
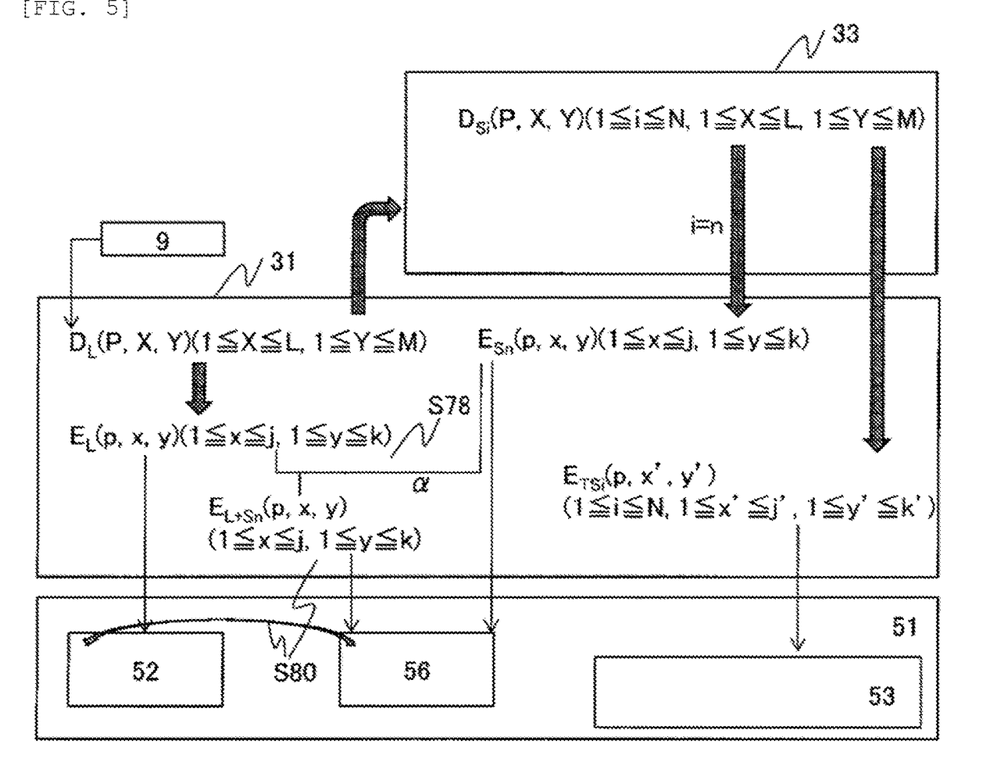
FIG. 5 is a diagram showing data processing according to the embodiment of the present invention.
Figure 6:
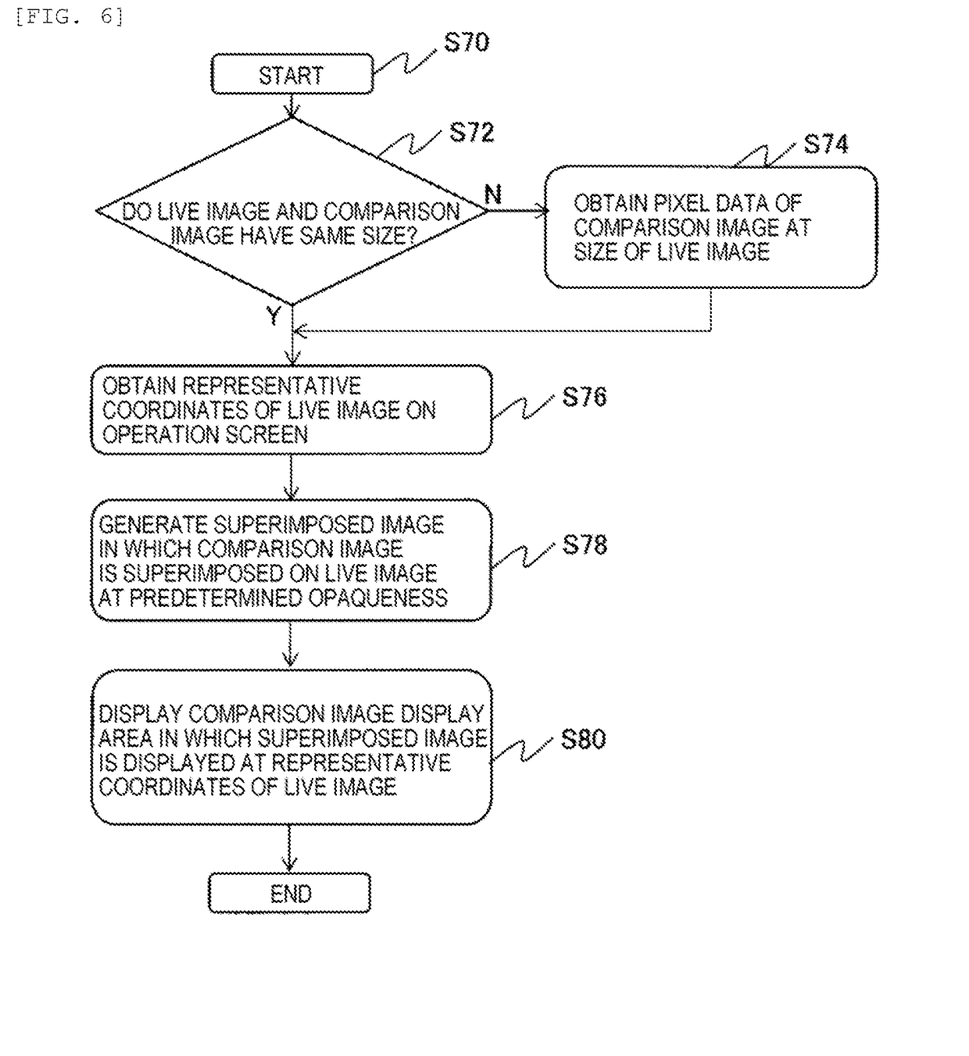
FIG. 6 is a flowchart of a process for overlaying a live image and a comparison image according to the embodiment of the present invention.

A processing flow for overlapping images will be described with reference to FIGS. 5 and 6. Signal electrons detected by a detector 9 are converted into image data DL (P, X, Y) ($1 \leq X \leq L$, $1 \leq Y \leq M$) in the control device 31. Image data is expressed as a set of pixel values P at the position (X, Y) in an image. In order to display the image data DL on the image display device 32, the image data DL is converted into display image data EL (p, x, y) ($1 \leq x \leq j$, $1 \leq y \leq k$) matching the size of the live image display area 52 and is displayed as the live image 100 in the live image display area 52 of the operation screen 51. On the other hand, when the observer captures an image, image data obtained from the detector 9 is stored in the storage device 33 as DSi (P, X, Y) ($1 \leq i \leq N$, $1 \leq X \leq L$, $1 \leq Y \leq M$). N denotes the number of images taken by the observer.

A captured image is converted into reduced display image data ETSi (p, x', y') ($1 \leq x' \leq j'$, $1 \leq y' \leq k'$) matching the size of the captured image display area 53 and, as described above, is displayed in the captured image display area 53 of the operation screen 51 as the reduced image 54. When the reduced image 54 is double-clicked (assuming that a reduced image of i=n is double-clicked), the display image data ESn (p, x, y) ($1 \leq x \leq j$, $1 \leq y \leq k$) matching the size of the comparison image display area 56 and is displayed in the comparison image display area 56 of the operation screen 51 as the comparison image 101.

By detecting a click of the button 57 in this state (see FIG. 3), a display controller 36 starts processing (S70). Here, a processing start command may be input, for example, by a predetermined key manipulation of the operation panel 34. First, it is checked whether a live image and a comparison image are of the same size (S72). In the example shown in FIG. 5, the sizes of the live image and the comparison image are the same. However, when the size of a live image is different from that of a comparison image, pixel data of the comparison image at the size of the live image is obtained (S74). Next, the representative coordinates of the live image on the operation screen 51 is obtained (S76).

For example, as shown in FIG. 2, with a pixel 60 at the upper left corner of the operation screen 51 as an origin, the coordinates of an arbitrary pixel Q on the operation screen 51 are expressed as Q(a, b) and the upper left corner of the display area is used as the representative coordinate, the coordinate QL(a1, b1) of a pixel 61 is obtained as the representative coordinate of the live image display area. Here, the method of assigning the coordinate of the operation screen 51 and the method of assigning the representative image of the display area are not limited thereto, and any method may be used as long as the coordinate is identifiable. In addition, when the live image display area 52 is fixed on the operation screen 51, this step can be omitted.

Next, a superimposed image obtained by superimposing a comparison image with the same size and a predetermined opaqueness to a live image is generated (S78). For example, alpha blending technique is applied to superimposing two images. In the alpha blending technique, as a pixel value, each pixel includes an alpha value a indicating transparency. As a result, by mixing colors of pixels of the live image and colors of pixels of the comparison image at ratios corresponding to the alpha values a, a superimposed image in which the translucent comparison image is superimposed on the live image can be generated. The generated superposed image is displayed in the comparison image display area 56 and the comparison image display area 56 is displayed at the position of the representative coordinate of the live image (S80). This can be realized by setting the value of the coordinate QC (ac, bc) of a pixel 62, which is the representative coordinate of the comparison image display region, to the coordinate (a1, a1).

Here, the superimposed image may also be displayed in the live image display area 52.

In this case, the comparison image display area 56 is not moved. Since the superimposed image is displayed in the live image display area 52, the same effect can be obtained.

Figure 7:
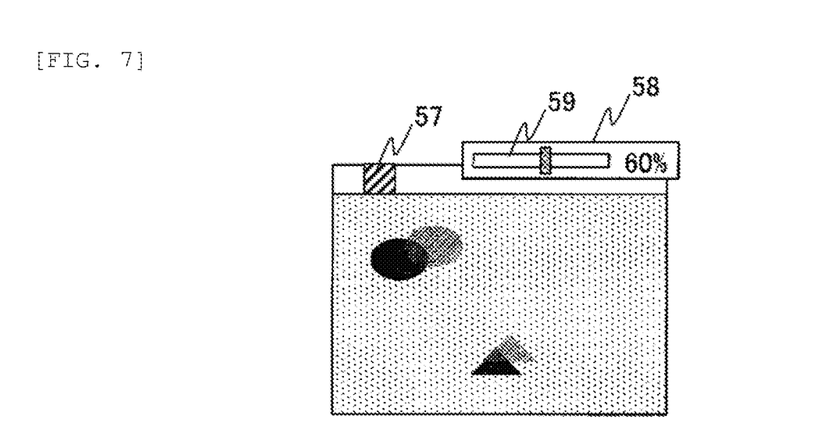
FIG. 7 is a diagram showing an example of a transparency setting screen.

Furthermore, as shown in FIG. 7, in order to adjust the translucent transparency, a transparency adjustment tool 58 is displayed when the mouse is moved over the button 57. Transparency may be adjusted by a slider 59 or by directly inputting a numerical value. At this time, the transparency may be input as a ratio or a value of the alpha value a (0 to 255) may be directly input. The transparency set here is stored in the storage device 33.

In the present embodiment, two images are overlapped for the purpose of adjusting the field of view of a live image, but various methods may be considered for image processing. For example, contour lines may be extracted from a comparison image to be overlapped on a live image. However, the method of the present embodiment in which a comparison image is translucent and superimposed on a live image is considered advantageous in the following points. First, since only values of pixels to be displayed on the image display device 32 need to be calculated, the processing load is small, and thus it is possible to easily follow the operation of the observer. In addition, if a foreign object is used as a marker, it may be difficult to align images without extracting contour lines at a certain precision.

Although the present embodiment has been described above in detail, various modifications can be made. For example, a plurality of comparison image display areas 56 can be displayed on the operation screen 51, and the button 57 is provided in each of the comparison image display areas 56. As the buttons 57 of any one of the comparison image display areas 56 is clicked, a comparison image displayed in the corresponding comparison image display area 56 is made translucent, and a superimposed image obtained by superimposing the translucent comparison image on a live image is displayed. Furthermore, in this state, when the button 57 of another comparison image display area 56 is clicked, a comparison image displayed in the comparison image display area 56 where the button 57 is clicked is made translucent and the superimposed image obtained by superimposing the translucent comparison image on a live image is replaced.

In case of displaying a plurality of comparison images, it is preferable to use a common transparency value for the set transparency value. In other words, transparency set to one comparison image is also reflected in other comparison images. Since many of images taken by one measurement are similar to one another, it is convenient for an observer to reflect one set value to all comparison images instead of storing different set values for respective comparison images. Therefore, for example, the latest transparency is set for a plurality of captured images displayed in the captured image display area 53. Furthermore, when the brightness differs from one image to another in one measurement, one transparency value may be set for one comparison image and, after the transparency value is reflected in all comparison images, the observer may set different transparency.

In order to simultaneously display images of various different signals as live images on the operation screen 51, images may be displayed in multiple screens, such as two screens or four screens, in the live image display area 52. Since a screen for manually adjusting the brightness and the contrast of an image needs to be limited to one screen, even in the case of the multi-screen display, only one screen is selected. When the live image display area 52 displays images in multi-screens and the button 57 of the comparison image display area 56 is pressed, a comparison image is superimposed on a live image whose brightness and contrast can be adjusted, that is, a selected live image.

Figure 8:
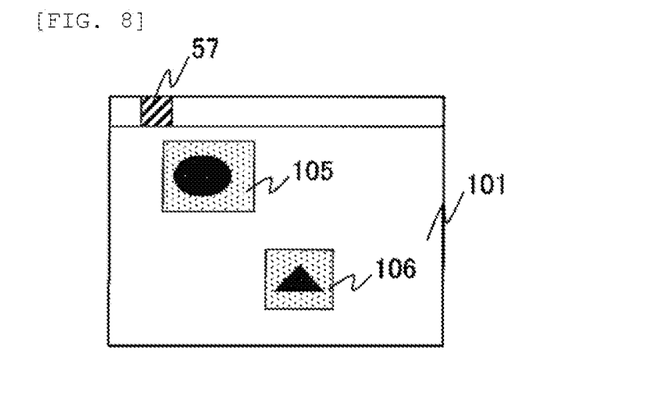
FIG. 8 is a diagram showing an example of changing the transparency of a part of a comparison image.

Furthermore, as shown in FIG. 8, regions to be made translucent are designated to be regions 105 and 106 in the comparison image 101 and only the designated regions of the comparison image 101 can be made translucent and superimposed whereas the other regions of the comparison image are not superimposed (transparency is set to 100%). As a result, there is an advantage that portions of a live image irrelevant to an adjustment of the field of view can be clearly seen.

REFERENCE SIGNS LIST

1: electron gun
2: primary electron beam
3: first focusing lens
4: objective aperture
5: second focusing lens
6: objective lens
7: deflector coil
8: sample stage
9: detector
10: sub-stage
11: sample
20: lens barrel
21: sample chamber
31: control device
32: image display device
33: storage device
34: operation panel

The invention claimed is:

1. A charged particle beam apparatus comprising:
   a charged particle optical system including a charged particle beam source, a focusing lens configured to focus a primary charged particle beam emitted from the charged particle beam source, an objective lens configured to focus the primary charged particle beam onto a sample, a deflector coil configured to scan the sample with the primary charged particle beam, and a detector configured to detect secondary charged particles generated by irradiation of the primary charged particle beam on the sample;
   an operation panel configured to receive controls of an operator;
   an image display device including a plurality of display areas;
   a control device connected to the operation panel and the image display device and including a device controller and a display controller; and
   a storage device configured to store image data captured by the charged particle optical system, wherein
   the device controller receives a control from the operation panel, controls the charged particle optical system, and obtains image data,
   the display controller displays a live image obtained from the charged particle optical system in a first display area of the image display device and displays a comparison image stored in the storage device in a second display area of the image display device,
   the display controller receives a control from the operation panel, determining designated regions of the comparison image, obtains a superimposed image by making only designated regions of the comparison image translucent, and superimposes only the designated regions of the translucent comparison image on the live image, at a corresponding-position of the first display area of the image display device, and the other regions of the comparison image are not superimposed on the live image,
   the display controller displays the superimposed image responsive to receiving a first control from the operation panel.

2. The charged particle beam apparatus according to claim 1, wherein
   the second display area, in which the superimposed image is displayed, is displayed at the position of the first display area of the image display device.

3. The charged particle beam apparatus according to claim 1, wherein
   the display controller displays the superimposed image in the first display area.

4. The charged particle beam apparatus according to claim 1, wherein
   the display controller displays a transparency adjustment tool for adjusting the transparency as the transparency adjustment tool receives a second control from the operation panel.

5. The charged particle beam apparatus according to claim 1, wherein
   the display controller displays a plurality of captured images, which are stored in the storage device, in a third display area of the image display device as reduced images,
   the display controller displays one of the plurality of captured images, which is selected by the operation panel, in the second display area as the comparison image, and
   the transparency is set to a common value for the plurality of captured images.

6. The charged particle beam apparatus according to claim 4, wherein the transparency adjustment tool is configured as a slider button.

7. The charged particle beam apparatus according to claim 4, wherein the transparency adjustment tool is configured as a numerical value input.

* * * * *